(12) United States Patent
Kuang

(10) Patent No.: US 10,424,621 B2
(45) Date of Patent: Sep. 24, 2019

(54) MANUFACTURING METHOD FOR WHITE OLED DEVICE

(71) Applicant: SHENZHEN CHINA STAR OPTOELECTRONICS TECHNOLOGY CO., LTD., Shenzhen, Guangdong (CN)

(72) Inventor: Youyuan Kuang, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/768,803

(22) PCT Filed: Mar. 6, 2018

(86) PCT No.: PCT/CN2018/078186
§ 371 (c)(1),
(2) Date: Apr. 16, 2018

(87) PCT Pub. No.: WO2019/140754
PCT Pub. Date: Jul. 25, 2019

(65) Prior Publication Data
US 2019/0229157 A1    Jul. 25, 2019

(30) Foreign Application Priority Data
Jan. 19, 2018    (CN) .......................... 2018 1 0055711

(51) Int. Cl.
*H01L 51/50*    (2006.01)
*H01L 27/32*    (2006.01)
(Continued)

(52) U.S. Cl.
CPC ........ *H01L 27/3209* (2013.01); *H01L 23/544* (2013.01); *H01L 51/003* (2013.01);
(Continued)

(58) Field of Classification Search
CPC ... H01L 51/00; H01L 51/003; H01L 51/0097; H01L 51/56; H01L 51/52; H01L 51/5234;
(Continued)

(56) References Cited

U.S. PATENT DOCUMENTS 3,531,281 A * 9/1970 Rust .................. G03F 7/027
430/269
2016/0172330 A1* 6/2016 Hack .................. H01L 51/5271
257/40

FOREIGN PATENT DOCUMENTS

CN     101055923 A    10/2007
CN     104183746 A    12/2014
(Continued)

*Primary Examiner* — Chuong A Luu
(74) *Attorney, Agent, or Firm* — Leong C. Lei

(57) ABSTRACT

The invention provides a manufacturing method for white OLED device, comprising manufacturing a first OLED device and a corresponding second OLED device respectively on a first substrate and a second substrate, wherein the light emitted by the first OLED device and the light emitted by the second OLED device are mixed to form white light, and then the second OLED device is correspondingly stacked onto the first OLED device to obtain a white OLED device. The manufacturing method can greatly reduce the complicated process caused by layer-by-layer stacking of multi-layered films in the structure of known white OLED devices, without the need to address the complex issues caused by interlinking of multiple color devices and light color resonance, so as to greatly simplify the process.

14 Claims, 6 Drawing Sheets

(51) Int. Cl.
  *H01L 51/56* (2006.01)
  *H01L 51/52* (2006.01)
  *H01L 51/00* (2006.01)
  *H01L 23/544* (2006.01)
(52) U.S. Cl.
  CPC ...... *H01L 51/0097* (2013.01); *H01L 51/5218* (2013.01); *H01L 51/5234* (2013.01); *H01L 51/5246* (2013.01); *H01L 51/5262* (2013.01); *H01L 51/56* (2013.01); *H01L 2223/54426* (2013.01); *H01L 2251/5315* (2013.01); *H01L 2251/5338* (2013.01)
(58) Field of Classification Search
  CPC ............. H01L 51/5218; H01L 51/5246; H01L 51/5262; H01L 51/5287; H01L 51/50; H01L 51/525; H01L 51/5012; H01L 2924/12044; H01L 2251/5338; H01L 2251/5361; H01L 2251/566; H01L 2251/5315; H01L 2227/32; H01L 2227/326
  USPC ........................................................ 438/27
  See application file for complete search history.

(56) References Cited

FOREIGN PATENT DOCUMENTS

| | | | |
|---|---|---|---|
| CN | 104183770 | A | 12/2014 |
| CN | 104393184 | A | 3/2015 |
| CN | 106024839 | A | 10/2016 |

\* cited by examiner ized OLED display panels currently use the side-by-side structure of RGB pixels, the large-sized OLED display panel, however, prefers the tandem structure of WOLED and CF layer.

MANUFACTURING METHOD FOR WHITE OLED DEVICE

RELATED APPLICATIONS

The present application is a National Phase of International Application Number PCT/CN2018/078186, filed Mar. 6, 2018, and claims the priority of China Application No. 201810055711.7, filed Jan. 19, 2018.

BACKGROUND

1. Field of the Invention

The present invention relates to the field of display techniques, and in particular to a manufacturing method for white organic light-emitting diode (OLED) device.

2. The Related Arts

The active matrix panel display has many advantages, such as, thinness, power saving, and no radiation, and has been widely used. Among the competing technologies, the organic light-emitting diode (OLED) display technology is a panel display technology with promising development which has excellent display performance, in particular, the properties of self-luminous, simple structure, ultra-thin and light, fast response speed, wide viewing angle, low power consumption, flexible display, and so on, and is heralded as "dream display". Moreover, the setup investment in production equipment is far smaller than that of thin-film transistor-type liquid crystal displays (TFT-LCD), and has been preferred by major display manufacturers and become the mainstream of the display technology in the third generation display devices. At present, OLED is already on the edge of large-scale mass production. With in-depth research, new technologies are constantly emerging, and OLED display devices will surely have a breakthrough.

To achieve the full-color of the OLED display, one approach is to use a side-by-side structure wherein the red, green and blue (RGB) sub-pixels emit light respectively, and another approach is to use white OLEDs (WOLED) and color filter (CF) layer stacked in a tandem WOLED+CF structure. In WOLED, two or more light-emitting layers are connected through a charge generation layer (CGL) and emit white light. After the white light is filtered through the CF layer, RGB monochromatic light is obtained. Because the light-emitting layers are superposed, the structure is called a tandem structure. Because the tandem structure of the WOLED and the CF layer does not require an accurate masking process, the high resolution of the OLED display can be achieved. Therefore, although small and medium sized OLED display panels currently use the side-by-side structure of RGB pixels, the large-sized OLED display panel, however, prefers the tandem structure of WOLED and CF layer.

Therefore, the white OLED devices are still one of the important approaches of manufacturing large-sized display panels and lighting devices. At present, the white OLED devices mostly use three light-emitting layers (red R+green G+blue B, or blue B+yellow Y+blue B, or blue B+yellow Y+yellow Y), or two light-emitting layers (blue B+yellow Y) generate white light. As shown in FIG. 1, a known structure of a white OLED device using a BYB three-layer light-emitting layer comprises, from the bottom up, an anode layer 10, a first hole inject layer (HIL) 11, a first hole transport layer (HTL) 12, a first blue emitting layer (EML) 13, a first electron transport layer (ETL) 14, a first electron inject layer (EIL) 15, a first charge generation layer (CGL) 20, a second hole inject layer 21, a second hole transport layer 22, a yellow emitting layer 23, a second electron transport layer 24, second electron inject layer 25, a second charge generation layer 30, a third hole inject layer 31, a third hole transport layer 32, a second blue emitting layer 33, a third electron transport layer 34, a third electron inject layer 35 and a cathode layer 40. The evaporation deposition technique is complex and the process is complicated, which is not suitable for large-scale production.

SUMMARY OF THE INVENTION

To overcome the aforementioned disadvantages, the object of the present invention is to provide a manufacturing method for white OLED device, able to greatly reduce the complicated process caused by layer-by-layer stacking of multi-layered films in the structure of known white OLED devices, without the need to address the complex issues caused by interlinking of multiple color devices and light color resonance, so as to greatly simplify the process.

To achieve the above object, the present invention provides a manufacturing method for white OLED device, which comprises the following steps:

Step S1: manufacturing a first substrate and a second substrate, and manufacturing a first OLED device and a corresponding second OLED device respectively on the first substrate and the second substrate, wherein light emitted from the first OLED device and light emitted from the second LED device being mixed to form a white light;

Step S2: manufacturing a light extraction layer on the second OLED device;

Step S3: stacking a side on the second OLED device disposed with the light extraction layer onto the first OLED device to obtain a white OLED device.

According to a preferred embodiment of the present invention, the first OLED device is one of a blue OLED device or a yellow OLED device; and the second OLED device is the other of the blue OLED device or the yellow OLED device.

According to a preferred embodiment of the present invention, the first substrate and the second substrate manufactured in Step S1 are flexible substrates.

According to a preferred embodiment of the present invention, the first substrate and the second substrate manufactured in Step S1 belong to a large flexible substrate, and the manufacturing process comprises: providing a base substrate, manufacturing the large flexible substrate on the base substrate, and defining the first substrate and the second substrate on the large flexible substrate;

in Step S3, the stacking of the second OLED device of the second substrate onto the first OLED device of the first substrate is by flipping and folding the large flexible substrate.

According to a preferred embodiment of the present invention, Step S2, after manufacturing the light extraction layer, further comprises: removing the base substrate from the large flexible substrate.

According to a preferred embodiment of the present invention, the flexible substrate is made of polyethylene terephthalate.

According to a preferred embodiment of the present invention, Step S1 further comprises: making alignment marks on the first substrate and the second substrate;

in Step S3, the stacking of the second OLED device onto the first OLED device follows the alignment marks.

According to a preferred embodiment of the present invention, the first OLED device comprises: a first lower electrode layer, a first upper electrode layer, a first organic functional layer, and a first emitting layer, disposed in a stack;

the second OLED device comprises: a second lower electrode layer, a second upper electrode layer, a second organic functional layer, and a second emitting layer, disposed in a stack;

both the first emitting layer and the second emitting layer have pixel patterns, both the first emitting layer and the second emitting layer are patterned structure layers; and both the first organic functional layer and the second organic functional layer are entirety structure layers.

According to a preferred embodiment of the present invention, in the first OLED device, the first lower electrode layer and the first upper electrode layer are disposed in order of bottom up on the first substrate;

in the second OLED device, the second lower electrode layer and the second upper electrode layer are disposed in order of bottom up on the second substrate;

one of the first lower electrode layer and the second lower electrode layer is made of reflective material, and the other is made of transparent material; both the first upper electrode layer and the second upper electrode layer are made of transparent material.

According to a preferred embodiment of the present invention, Step S2 further comprises manufacturing sealant on edges of the first substrate and the second substrate;

in Step S3, the sealant adheres the first substrate to the second substrate to accomplish packaging the white OLED device.

The present invention also provides a manufacturing method for white OLED device, which comprises the following steps;

Step S1; manufacturing a first substrate and a second substrate, and manufacturing a first OLED device and a corresponding second OLED device respectively on the first substrate and the second substrate, wherein light emitted from the first OLED device and light emitted from the second OLED device being mixed to form a white light;

Step S2: manufacturing a light extraction layer on the second OLED device;

Step S3; stacking a side on the second OLED device disposed with the light extraction layer onto the first OLED device to obtain a white OLED device;

wherein the first OLED device being one of a blue OLED device or a yellow OLED device; and the second OLED device being the other of the blue OLED device or the yellow OLED device;

wherein the first substrate and the second substrate manufactured in Step S1 being flexible substrates;

wherein the first substrate and the second substrate manufactured in Step S1 belonging to a large flexible substrate, and the manufacturing process comprising: providing a base substrate, manufacturing the large flexible substrate on the base substrate, and defining the first substrate and the second substrate on the large flexible substrate;

in Step S3, the stacking of the second OLED device of the second substrate onto the first OLED device of the first substrate being by flipping and folding the large flexible substrate.

wherein Step S2, after manufacturing the light extraction layer, further comprising: removing the base substrate from the large flexible substrate.

The present invention provides the following advantages: the present invention provides a manufacturing method for white OLED device, comprising manufacturing a first OLED device and a corresponding second OLED device respectively on a first substrate and a second substrate, wherein the light emitted by the first OLED device and the light emitted by the second OLED device are mixed to form white light, and then the second OLED device is correspondingly stacked onto the first OLED device to obtain a white OLED device. The manufacturing method can greatly reduce the complicated process caused by layer-by-layer stacking of multi-layered films in the structure of known white OLED devices, without the need to address the complex issues caused by interlinking of multiple color devices and light color resonance, so as to greatly simplify the process.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To enable those skilled in the art to better understand the technical solutions in the present invention, the technical solutions in the embodiments of the present invention are clearly and completely described in the following with reference to the accompanying drawings in the embodiments of the present invention. Apparently, the described embodiments are only a part but not all of the embodiments of the present invention. All other embodiments obtained by a person of ordinary skill in the art based on the embodiments of the present invention without creative efforts shall fall within the protection scope of the present invention.

Figure 1:
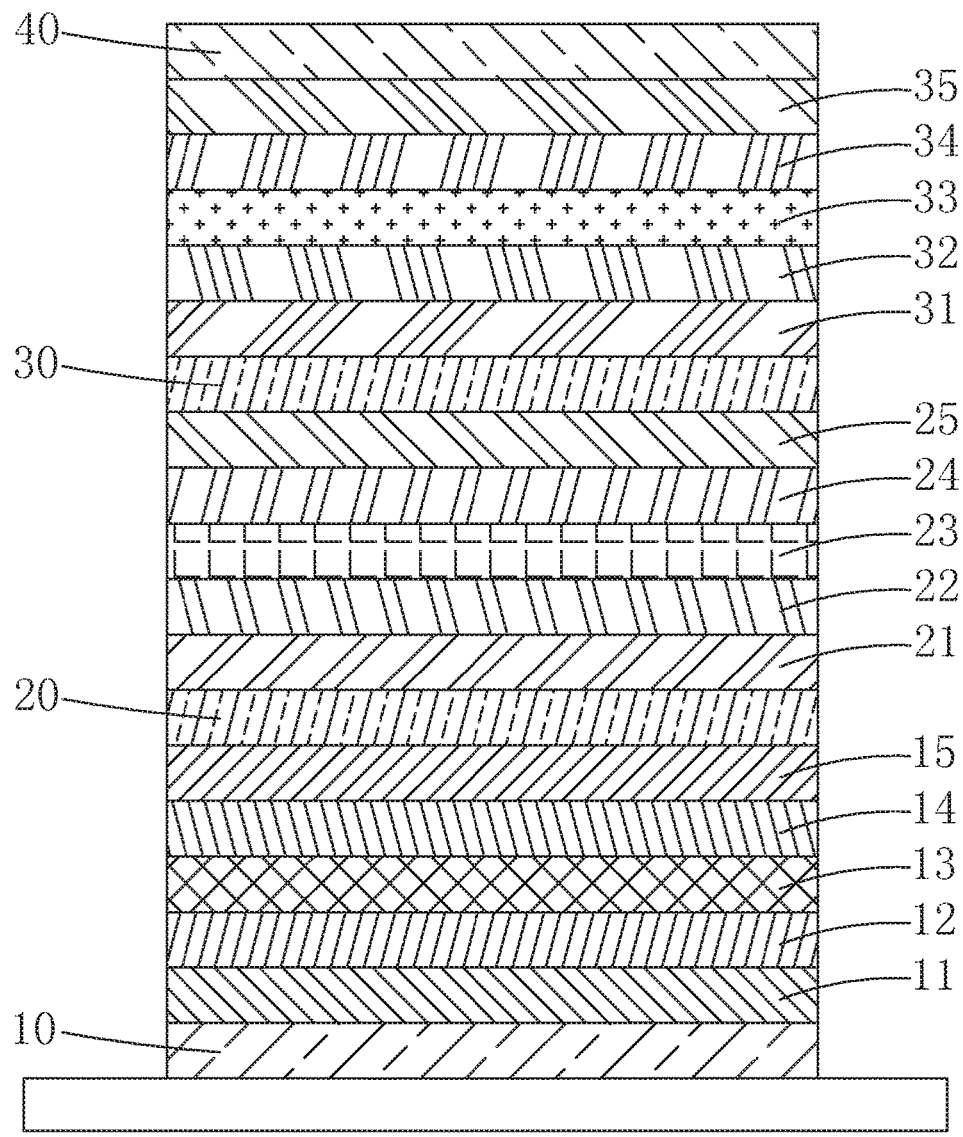
FIG. 1 is a schematic view showing the structure of a known white OLED device.
Figure 2:
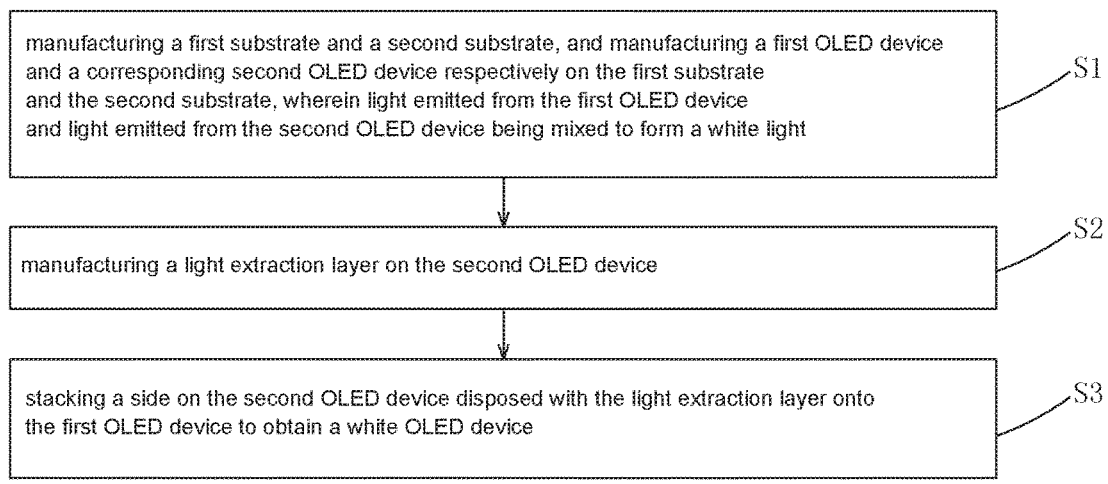
FIG. 2 is a schematic view showing the flowchart of the manufacturing method for white OLED device according to the embodiment of the present invention.
Figure 3:
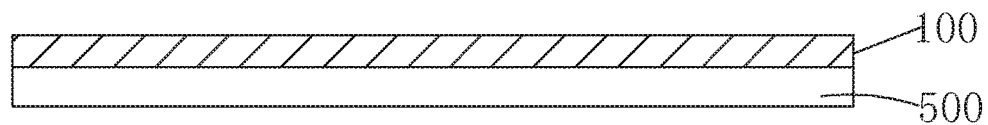
FIGS. 3-5 are schematic views showing Step S1 of the manufacturing method for white OLED device according to the embodiment of the present invention.
Figure 4:
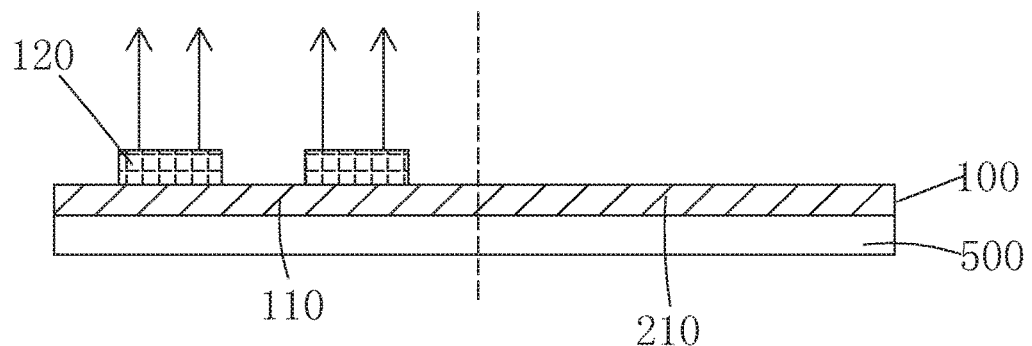
Figure 5:
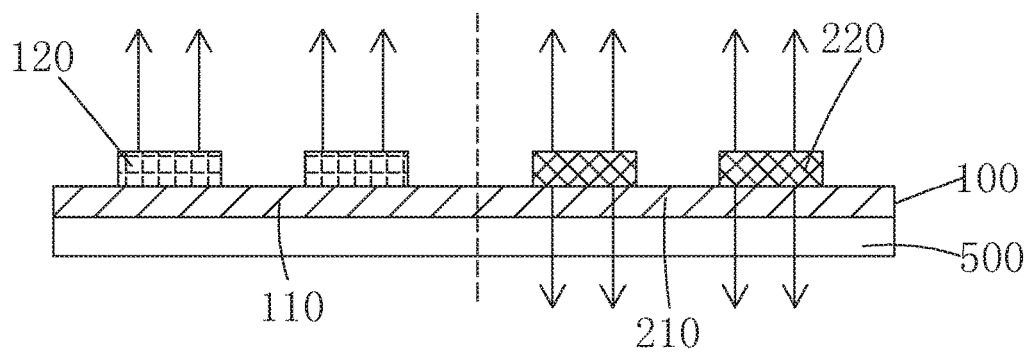

Referring to FIG. 2, the present invention provides a manufacturing method for white OLED device, which comprises the following steps:

Step S1: as shown in FIGS. 3-5, manufacturing a first substrate 110 and a second substrate 210, and manufacturing a first OLED device 120 and a corresponding second OLED device 220 respectively on the first substrate 110 and the second substrate 210, wherein light emitted from the first OLED device 120 and light emitted from the second OLED device 220 are mixed to form a white light.

Specifically, the first OLED device 120 and the second OLED device 220 are blue OLED device and yellow OLED device, respectively.

Specifically, the first substrate 110 and the second substrate 120 manufactured in Step S1 are flexible substrates. The flexible substrate is made of a highly light transmissive material, such as, polyethylene terephthalate (PET).

Moreover, the first substrate 110 and the second substrate 210 manufactured in Step S1 belong to a large flexible substrate 100, and the manufacturing process comprises: providing a base substrate 500, manufacturing the large flexible substrate 100 on the base substrate 500, and defining the first substrate 110 and the second substrate 210 on the large flexible substrate 100.

Figure 6:
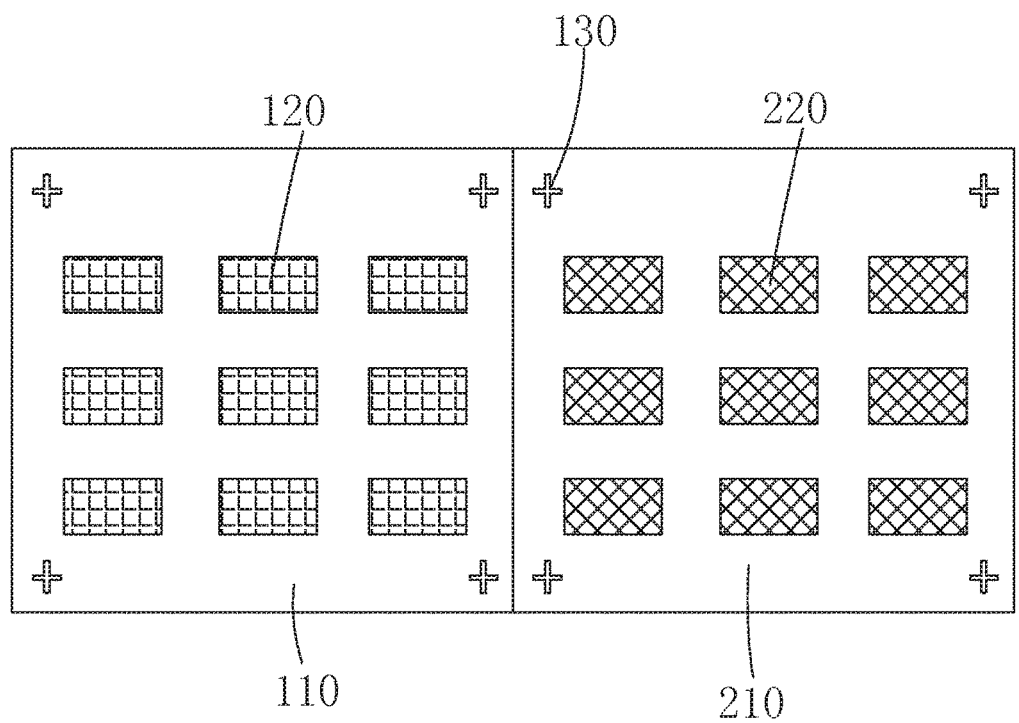
FIG. 6 is a schematic view showing the structure in FIG. 5.

Specifically, as shown in FIG. 6, Step S1 further comprises: making alignment marks 130 on the first substrate 110 and the second substrate 210.

Specifically, the first OLED device 120 comprises: a first lower electrode layer, a first upper electrode layer, a first organic functional layer, and a first emitting layer (not shown), disposed in a stack; wherein in the first OLED device 120, the first lower electrode layer and the first upper electrode layer are disposed in order of bottom up on the first substrate 110, the first organic functional layer and the first emitting layer are disposed between the first lower electrode layer and the first upper electrode layer;

the second OLED device 220 comprises: a second lower electrode layer, a second upper electrode layer, a second organic functional layer, and a second emitting layer (not shown), disposed in a stack; wherein in the second OLED device 220, the second lower electrode layer and the second upper electrode layer are disposed in order of bottom up on the second substrate 210, the second organic functional layer and the second emitting layer are disposed between the second lower electrode layer and the second upper electrode layer.

Specifically, both the first emitting layer and the second emitting layer have pixel patterns, both the first emitting layer and the second emitting layer are patterned structure layers; and both the first organic functional layer and the second organic functional layer are entirety structure layers.

Specifically, one of the first lower electrode layer and the second lower electrode layer is made of reflective material, and the other is made of transparent material; both the first upper electrode layer and the second upper electrode layer are made of transparent material, such as, Mg/Ag alloy. In other words, one of the first OLED device 120 and the second OLED device 220 emits light n the direction away from the large flexible substrate 100, and the other emits light towards the large flexible substrate 100.

Figure 7:
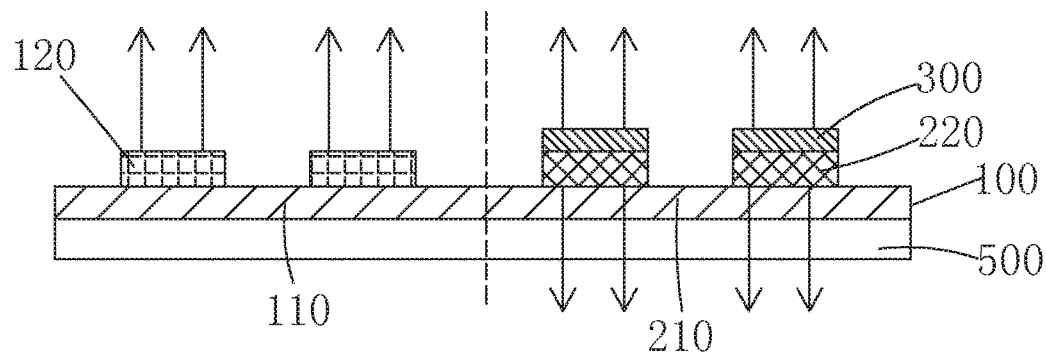
FIGS. 7-9 are schematic views showing Step S2 of the manufacturing method for white OLED device according to the embodiment of the present invention.
Figure 8:
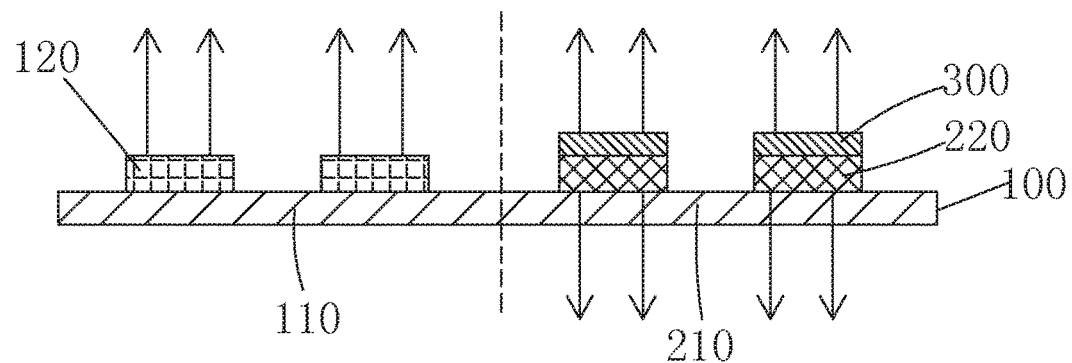
Figure 9:
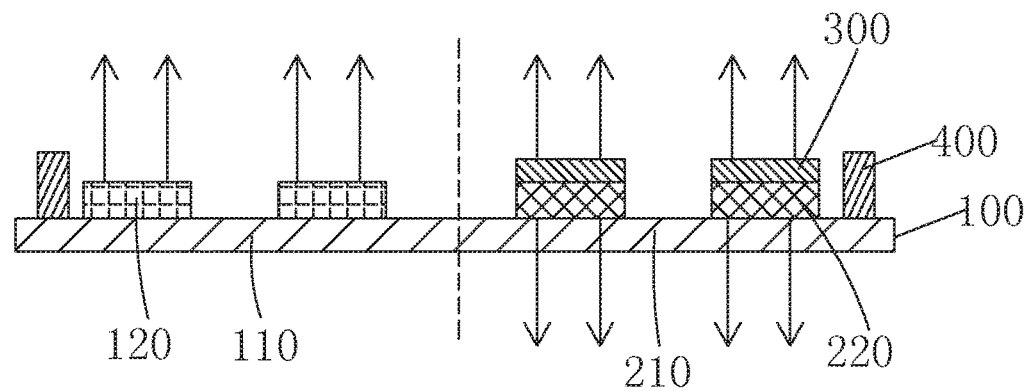

Step S2: as shown in FIGS. 7-9, manufacturing a light extraction layer 300 on the second OLED device 220; removing the base substrate 500 from the large flexible substrate 100; and manufacturing sealant 400 on edges of the first substrate 110 and the second substrate 210.

Specifically, the light extraction can further serve as a buffer layer.

Figure 10:
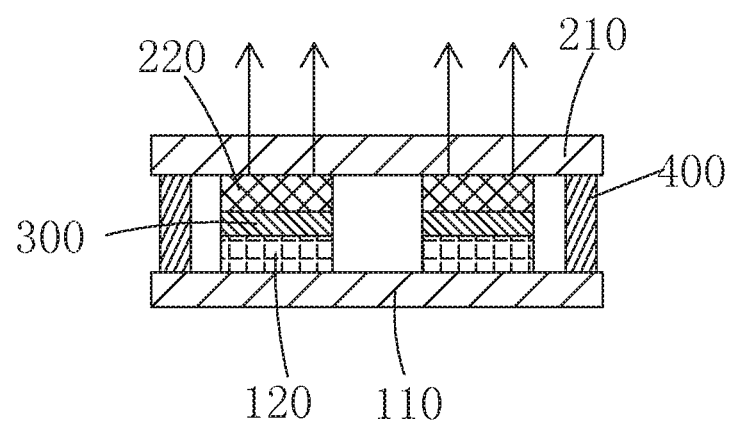
FIG. 10 is a schematic view showing Step S3 of the manufacturing method for white OLED device according to the embodiment of the present invention.

Step S3: as shown in FIG. 10, by flipping and folding the large flexible substrate 100, and according to the alignment marks 130 to stack a side on the second OLED device 220 disposed with the light extraction layer 300 onto the first OLED device 120 to obtain a white OLED device.

Specifically, in Step S3, the sealant 400 adheres the first substrate 110 to the second substrate 120 to accomplish packaging the white OLED device.

The manufacturing method for white OLED device of the present invention, by manufacturing a first OLED device and a corresponding second OLED device respectively on a first substrate and a second substrate, and stacking correspondingly to obtain a white OLED device. The manufacturing method can greatly reduce the complicated process caused by layer-by-layer stacking of multi-layered films in the structure of known white OLED devices, without the need to address the complex issues caused by interlinking of multiple color devices and light color resonance, so as to greatly simplify the process.

In summary, the present invention provides a manufacturing method for white OLED device, comprising manufacturing a first OLED device and a corresponding second OLED device respectively on a first substrate and a second substrate, wherein the light emitted by the first OLED device and the light emitted by the second OLED device are mixed to form white light, and then the second OLED device is correspondingly stacked onto the first OLED device to obtain a white OLED device. The manufacturing method can greatly reduce the complicated process caused by layer-by-layer stacking of multi-layered films in the structure of known white OLED devices, without the need to address the complex issues caused by interlinking of multiple color devices and light color resonance, so as to greatly simplify the process.

It will be apparent to those skilled in the art that the invention is not limited to the details of the foregoing exemplary embodiments, but that the present invention may be embodied in other specific forms without departing from the spirit or essential characteristics of the invention. Thus, the present examples are to be considered in all respects as illustrative and not restrictive, the scope of the invention being indicated by the appended claims rather than by the foregoing description, and thus is intended to be included in the claims. All changes which come within the meaning and range of equivalency of the appended claims are intended to be embraced therein. Any reference signs in the claims should not be construed as limiting the claim involved.

In addition, it should be understood that although the specification is described according to the embodiments, not every embodiment includes only one independent technical solution. This description of the specification is merely for the sake of clarity and the person skilled in the art should consider the specification as a whole, the technical solutions in the embodiments may also be combined as appropriate to form other embodiments that can be understood by those skilled in the art.

What is claimed is:

1. A manufacturing method for white OLED device, comprising the following steps:

Step S1: manufacturing a first substrate and a second substrate, and manufacturing a first OLED device and a corresponding second OLED device respectively on the first substrate and the second substrate, wherein light emitted from the first OLED device and light emitted from the second OLED device being mixed to form a white light;

Step S2: manufacturing a light extraction layer on the second OLED device;

Step S3: stacking a side on the second OLED device disposed with the light extraction layer onto the first OLED device to obtain a white OLED device;

wherein the first substrate and the second substrate manufactured in Step S1 are flexible substrates;

wherein the first substrate and the second substrate manufactured in Step S1 belong to a large flexible substrate, and the manufacturing process comprises: providing a base substrate, manufacturing the large flexible substrate on the base substrate, and defining the first substrate and the second substrate on the large flexible substrate;

in Step S3, the stacking of the second OLED device of the second substrate onto the first OLED device of the first substrate is by flipping and folding the large flexible substrate.

2. The manufacturing method for white OLED device as claimed in claim 1, wherein the first OLED device is one of a blue OLED device or a yellow OLED device; and the second OLED device is the other of the blue OLED device or the yellow OLED device.

3. The manufacturing method for white OLED device as claimed in claim 1, wherein Step S2, after manufacturing the light extraction layer, further comprises: removing the base substrate from the large flexible substrate.

4. The manufacturing method for white OLED device as claimed in claim 1, wherein the flexible substrate is made of polyethylene terephthalate.

5. The manufacturing method for white OLED device as claimed in claim 1, wherein Step S1 further comprises: making alignment marks on the first substrate and the second substrate;

in Step S3, the stacking of the second OLED device onto the first OLED device follows the alignment marks.

6. The manufacturing method for white OLED device as claimed in claim 1, wherein the first OLED device comprises: a first lower electrode layer, a first upper electrode layer, a first organic functional layer, and a first emitting layer, disposed in a stack;

the second OLED device comprises: a second lower electrode layer, a second upper electrode layer, a second organic functional layer, and a second emitting layer, disposed in a stack;

both the first emitting layer and the second emitting layer have pixel patterns, both the first emitting layer and the second emitting layer are patterned structure layers; and both the first organic functional layer and the second organic functional layer are entirety structure layers.

7. The manufacturing method for white OLED device as claimed in claim 6, wherein in the first OLED device, the first lower electrode layer and the first upper electrode layer are disposed in order of bottom up on the first substrate;

in the second OLED device, the second lower electrode layer and the second upper electrode layer are disposed in order of bottom up on the second substrate;

one of the first lower electrode layer and the second lower electrode layer is made of reflective material, and the other is made of transparent material; both the first upper electrode layer and the second upper electrode layer are made of transparent material.

8. The manufacturing method for white OLED device as claimed in claim 1, wherein Step S2 further comprises manufacturing sealant on edges of the first substrate and the second substrate;

in Step S3, the sealant adheres the first substrate to the second substrate to accomplish packaging the white OLED device.

9. A manufacturing method for white OLED device, comprising the following steps:

Step S1: manufacturing a first substrate and a second substrate, and manufacturing a first OLED device and a corresponding second OLED device respectively on the first substrate and the second substrate, wherein light emitted from the first OLED device and light emitted from the second OLED device being mixed to form a white light;

Step S2: manufacturing a light extraction layer on the second OLED device;

Step S3: stacking a side on the second OLED device disposed with the light extraction layer onto the first OLED device to obtain a white OLED device;

wherein the first OLED device being one of a blue OLED device or a yellow OLED device; and the second OLED device being the other of the blue OLED device or the yellow OLED device;

wherein the first substrate and the second substrate manufactured in Step S1 being flexible substrates;

wherein the first substrate and the second substrate manufactured in Step S1 belonging to a large flexible substrate, and the manufacturing process comprising: providing a base substrate, manufacturing the large flexible substrate on the base substrate, and defining the first substrate and the second substrate on the large flexible substrate;

in Step S3, the stacking of the second OLED device of the second substrate onto the first OLED device of the first substrate being by flipping and folding the large flexible substrate;

wherein Step S2 further comprising: after manufacturing the light extraction layer, removing the base substrate from the large flexible substrate.

10. The manufacturing method for white OLED device as claimed in claim 9, wherein the flexible substrate is made of polyethylene terephthalate.

11. The manufacturing method for white OLED device as claimed in claim 9, wherein Step S1 further comprises: making alignment marks on the first substrate and the second substrate;

in Step S3, the stacking of the second OLED device onto the first OLED device follows the alignment marks.

12. The manufacturing method for white OLED device as claimed in claim 9, wherein the first OLED device comprises: a first lower electrode layer, a first upper electrode layer, a first organic functional layer, and a first emitting layer, disposed in a stack;

the second OLED device comprises: a second lower electrode layer, a second upper electrode layer, a second organic functional layer, and a second emitting layer, disposed in a stack;

both the first emitting layer and the second emitting layer have pixel patterns, both the first emitting layer and the second emitting layer are patterned structure layers; and both the first organic functional layer and the second organic functional layer are entirety structure layers.

13. The manufacturing method for white OLED device as claimed in claim 12, wherein in the first OLED device; the first lower electrode layer and the first upper electrode layer are disposed in order of bottom up on the first substrate;

in the second OLED device, the second lower electrode layer and the second upper electrode layer are disposed in order of bottom up on the second substrate;

one of the first lower electrode layer and the second lower electrode layer is made of reflective material, and the other is made of transparent material; both the first upper electrode layer and the second upper electrode layer are made of transparent material.

14. The manufacturing method for white OLED device as claimed in claim 9, wherein Step S2 further comprises manufacturing sealant on edges of the first substrate and the second substrate;

in Step S3, the sealant adheres the first substrate to the second substrate to accomplish packaging the white OLED device.

* * * * *